United States Patent [19]
Ohie et al.

[11] Patent Number: 5,936,448
[45] Date of Patent: Aug. 10, 1999

[54] INTEGRATED CIRCUIT HAVING INDEPENDENTLY TESTABLE INPUT-OUTPUT CIRCUITS AND TEST METHOD THEREFOR

[75] Inventors: Mitsuya Ohie; Kazutoshi Inoue; Toshihide Nagatome, all of Tokyo, Japan

[73] Assignee: Oki Electric Industry Co., Ltd., Tokyo, Japan

[21] Appl. No.: 08/864,672

[22] Filed: May 28, 1997

[30] Foreign Application Priority Data

Oct. 3, 1996 [JP] Japan .................................. 8-262836

[51] Int. Cl.⁶ .................................................. H03K 3/295
[52] U.S. Cl. ............................................ 327/205; 327/401
[58] Field of Search ..................... 327/206, 205, 327/185, 403, 392, 393–396, 400, 401, 564, 565; 326/56, 47; 365/230.03, 230.05

[56] References Cited

U.S. PATENT DOCUMENTS 5,479,607  12/1995  Tasaki et al. .......................... 395/166

*Primary Examiner*—My-Trang Nu Ton
*Attorney, Agent, or Firm*—Rabin & Champagne, P.C.

[57] ABSTRACT

An integrated circuit in which Schmitt input circuits can be tested in a short time and a highly accurate test result can be obtained. The integrated circuit includes switches each passing outputs of Schmitt inverters with inputs connected to input-output ports to the inputs of tristate circuits with outputs connected to adjacent input-output ports. The outputs of the Schmitt inverters may be blocked by the switches from being passed to internal logical circuits. A switch passes the output of the Schmitt inverter to the adjacent tristate circuit during the test of the Schmitt inverter. Alternately, each half of the Schmitt inverters can be tested as predetermined control signals selectively control each switch and each tristate circuit.

10 Claims, 6 Drawing Sheets

INTEGRATED CIRCUIT HAVING INDEPENDENTLY TESTABLE INPUT-OUTPUT CIRCUITS AND TEST METHOD THEREFOR

BACKGROUND OF THE INVENTION

1. Field of the Invention

The present invention relates to an integrated circuit, more particularly, to an integrated circuit having Schmitt input circuits.

2. Description of the Related Art

It is known that, when an input signal which varies slowly (e.g. psec order) is input into an integrated circuit with a an signal threshold type input circuit, a phenomenon (hazard) or an abnormality occurs. Thus, most integrated circuits-are provided with Schmitt trigger input circuits in order to avoid this hazard.

When an integrated circuit having Schmitt input circuits is fabricated, it is necessary to test whether the hysteresis is acceptable, namely, whether the threshold voltages at a H (high) side/a L (low) side of each Schmitt input circuit are acceptable values or not. Conventionally, the test, which is a so-called functional test, is performed by operating internal logic circuits. The the H side threshold voltage ($V_{TH}$) of a Schmitt input circuit is measured by repeating the functional test while the level of the signal inputted to the Schmitt input circuit is increased in steps by a predetermined step amount (e.g. 0.1 V) from the GND level. Then, it is determined whether the signal inputted to the Schmitt circuit is recognized as "H" or as "L". The input signal level at which the recognized result changes from "L" to "H" is defined as the $V_{TH}$. The L side threshold voltage ($V_{TL}$) is measured in a like functional test is repeated while the level of the signal inputted to the Schmitt input circuit is lowered.

As above described, in the conventional integrated circuit, the repeated functional test is required to test the Schmitt input circuit. Therefore, there is a problem that it takes a long time to test the Schmitt input circuit. Particularly, in a large standardized LSI such as a micro processor or a micro controller, the "functional test" is complex and takes a long time. Therefore, it takes a very long time to complete testing of all Schmitt input circuits on such a LSI.

Moreover, the above described test of the Schmitt input circuit is performed with a LSI tester and the like, Therefore, another problem is that measurement accuracy of the threshold voltage is influenced by power power supply noise in the test environment (e.g. a test board and a test socket). Particularly, in a micro controller or the like having a original operating frequency about 10–30 MHz, GND and $V_{DD}$ ambient noise of about 0.1–0.3 V may occur. Thus, though the $V_{TH}$ and the $V_{TL}$ of the Schmitt input circuit are measured under such an environment, accurate values can not be obtained. Usually, a value larger than the true value is measured as the $V_{TH}$, and a value smaller than the true value is measured as the $V_{TL}$. To reduce these measuring errors, the noise supply is decreased by lowering the operating frequency while threshold voltages are measured. However functional tests take a longer time when the operating frequency is lowered.

As above described, the conventional integrated circuit requires a long time to test the Schmitt input circuit and the accuracy of the test result is poor. These problems result in cost increase.

SUMMARY OF THE INVENTION

Accordingly, it is an object of the present invention to provide an integrated circuit in which it is possible to test Schmitt input circuits in a short time and to obtain more accurate test results.

A first integrated circuit according to the present invention comprises (a) an internal logic circuit, (b) plural input ports for inputting signals to be supplied to the internal logic circuit, (c) plural Schmitt input circuits for outputting signals corresponding to the signals inputted from the plural input ports, respectively, (d) plural output ports outputting signals from the internal logic circuit, and (e) plural switch circuits each connected to the internal logic circuit and to one of the plural Schmitt input circuits and to one of the plural output ports that is selected so as to reduce wiring amount by taking a positional relation between the connected Schmitt input circuit and the plural outputs ports into consideration, and feeding signal from the connected Schmitt circuit to the internal logic circuit or the connected output port.

That is, the first integrated circuit is provided with a switch circuit which can supply the output of the Schmitt input circuit to the output port so as to bypass the internal logic circuit every Schmitt input circuit. The input port to which each switch circuit outputs a signal is determined so as to reduce a wiring amount by taking a positional relation to the corresponding Schmitt input circuit into consideration and so as not to repeat. Thus, each switch in the first integrated circuit is made function, the plural Schmitt input circuits are connected to different output terminal one another.

As the result, in the first integrated circuit, the Schmitt input circuits can be tested without a parallel functional test. Therefore, it takes only a very short time to complete the test of the Schmitt input circuits. Further, during the test, since the internal logic circuit is bypassed, the power supply current reduces, therefore, the power supply noise reduces. Thus, it becomes also possible to measure the threshold voltage accurately free from power noise supply.

A second integrated circuit of the present invention comprises (a) an internal logic circuit, (b) plural input-output ports for inputting signals to be supplied to the internal logic circuit and for outputting signals from the internal logic circuit, (c) plural Schmitt input circuits outputting signals corresponding to the signals inputted from the plural input-output ports, respectively, (d) plural tristate circuits feeding signals from the internal logic circuit to the plural input-output ports, respectively, (e) a control circuit providing on-off control of the plural tristate circuits, and (f) plural switch circuits each connected to the internal logic circuit and to one of the plural Schmitt input circuits and to one of the plural tristate circuits that is selected so as to reduce wiring amount by taking a positional relation between the connected Schmitt input circuit and the plural tristate circuits into consideration, and feeding signal from the connected Schmitt circuit to the internal logic circuit or the connected tristate circuit.

That is, the second integrated circuit is provided with a switch circuit which can supply the output of the Schmitt input circuit connected with the input-output port to another input-output port so as to bypass the internal logic circuit through the tristate circuit every Schmitt input circuit. The tristate circuit to which each switch circuit outputs a signal is determined so as to reduce a wiring amount by taking a positional relation to the corresponding Schmitt input circuit into consideration and so as not to repeat. Thus, each switch in the second integrated circuit is made function, the plural Schmitt circuits are connected to different input-output terminals one another through the tristate circuits.

Further, the integrated circuit is provided with the control circuit controlling ON and OFF in the tristate circuit. The control circuit controls a first tristate circuit with its output connected to the same input-output port as a Schmitt input circuit to be tested in an OFF state, and a second tristate circuit to which the output of the Schmitt input circuit is coupled in an ON state. Further, the switch circuits function such that half of the Schmitt input circuits provided in the integrated circuit can be tested simultaneously. The remaining half of the Schmitt input circuits can be also tested by switching ON-OFF states in each of the tristate circuits.

As the result, in the second performed embodiment integrated circuit, the plural input-output ports provided with the Schmitt input circuits can be tested half-and-half. Therefore, it takes only a very short time to complete testing the Schmitt input circuits. Further, during the test, since the internal logic circuit is bypassed, the power supply transient currents are reduced. Therefore, the power noise is reduced. Thus, it becomes also possible to measure the threshold voltage accurately free from power supply noise. Moreover, input-output ports related circuits which are usually arranged to be adjacent in the integrated circuit are merely connected through switch circuits one another. Therefore, no layout problems such as a wiring area expansion.

In fabricating the second integrated circuit, it is desirable that the plural switch circuits and the plural tristate circuits are connected so as to be able to test the plural Schmitt input circuits without changing pairs of input-output ports used for testing the plural Schmitt input circuits. That is, it is desirable that a connection between the respective circuits (selection of circuits to be connected) is made for testing pairs of input-output ports.

The second integrated circuit further may comprise (g) an input port for inputting a signal to be supplied to the internal logic circuit, (h) a second Schmitt input circuit outputting a signal corresponding to the signal from the input port, (i) a logic operational circuit inserted between a tristate circuit, which is selected so as to reduce wiring, a corresponding switch circuit, and outputting logic providing an operational result of signals inputted from the connected switch circuit and a signal input terminal to the connected tristate circuit, and (j) a second switch circuit feeding the signal from the second Schmitt input circuit to the signal input terminal of the logical operational circuit or the internal logic circuit.

That is, when an integrated circuit with an input port used only for the signal input and plural input-output ports is fabricated, it is desirable to add switch circuits and a logic operational circuit (such as an AND circuit and an OR circuit) in order to use an input-output port also as a port which the output signal of the second Schmitt circuit connected to the second Schmitt circuit is outputted.

BRIEF DESCRIPTION OF THE DRAWINGS

Other objects and advantages of the present invention will become apparent during the following discussion conjunction with the accompanying drawings, in which.

DETAILED DESCRIPTION OF THE PREFERRED EMBODIMENTS

Preferred embodiments of the present invention will now be described with reference to the accompanying drawings.
<First Embodiment>

An integrated circuit in the first embodiment is that circuits for testing Schmitt inverters are added to a micro controller LSI having even-numbered input-output ports connected to Schmitt inverters.

Figure 1:
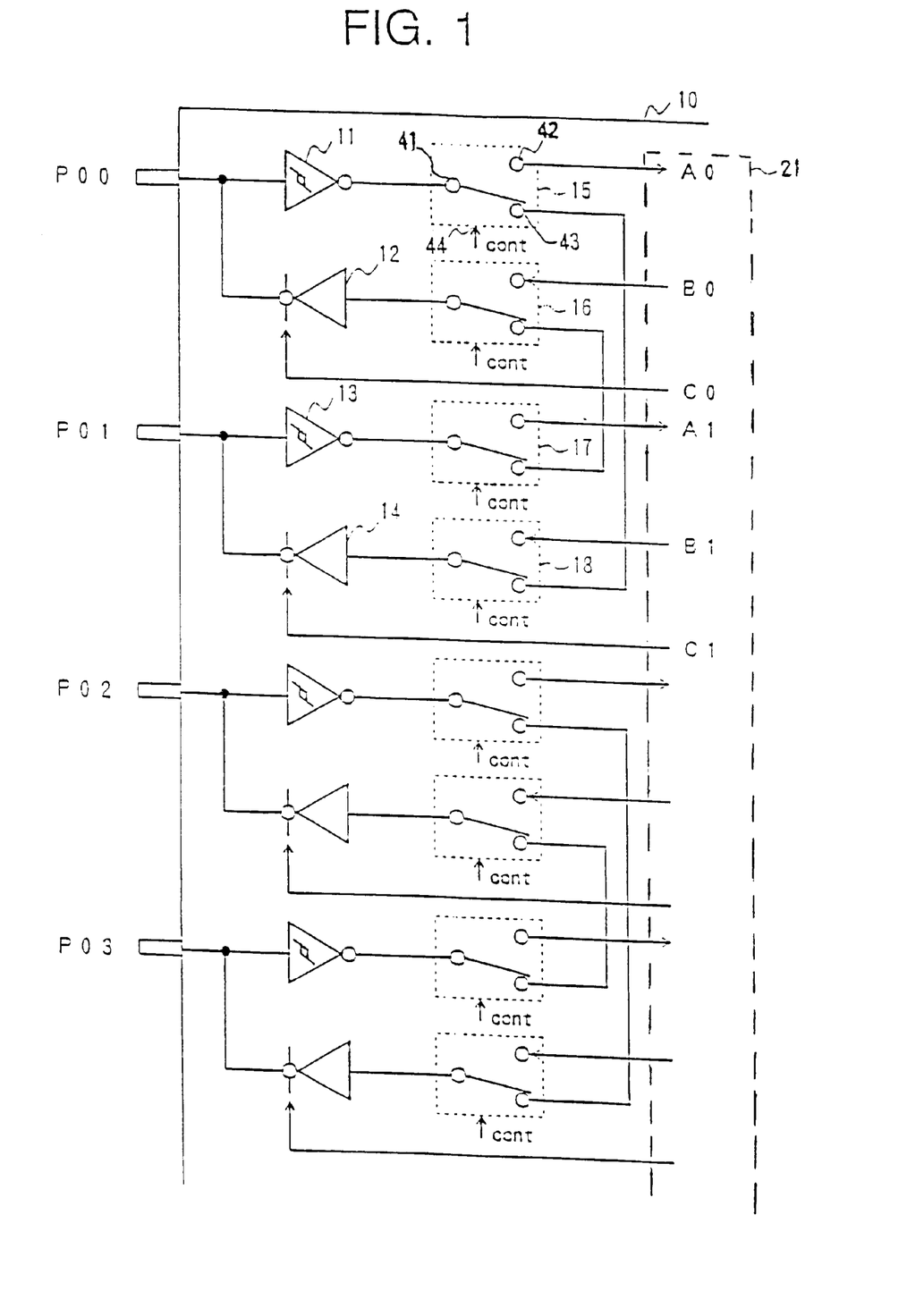
FIG. 1 is a circuit diagram illustrating an outline of an integrated circuit according to the first embodiment of the present invention.

FIG. 1 shows an outline 10 of an integrated circuit according to the first embodiment. As shown in FIG. 1, four input output ports P00–P03 are provided in integrated circuit 10. Each port P00–P03 is connected to an input terminal of a respective Schmitt inverter 11 (e.g. 11 and 13), an output terminal of a respective tristate circuit (e.g. 12 and 14). Input-output ports P02 and P03 are connected identically with a Schmitt inverter, a tristate circuit and switches.

The output terminals of the representative Schmitt inverters 11, 13 are respectively connected with common terminals of corresponding switches 15, 17. The input terminals of the representative tristate circuits 12, 14 are respectively connected with common terminals of corresponding switches 16, 18. Control signal cont input at control terminals of the tristate circuits 12, 14 are respectively controlled by nodes C0, C1 of an internal logic circuit (not shown). In usual operation, a control signal for controlling the tristate circuit 12 or 14 to select its ON state when the input-output port is used as an output port. As known, controlling (input/output designation) the tristate circuit like this is programmable in a micro controller LSI. As described later, in this integrated circuit 10, when each Schmitt inverter e.g., 11 or 12, is tested, this tristate control function is used.

Each switch 15–18 is a circuit having a control signal input terminal, a common terminal, a first terminal and a second terminal, and connects the common terminal to one of the first terminal and the second terminal in accordance with the level of the control signal inputted into the control signal input terminal. The first terminal 42 is connected with the common terminal 41 when no "H" level control signal "cont" is inputted (usual operation). The first terminals of the switches 15–18 are connected with nodes A0, B0, A1, B1 of the internal logic circuit 21, respectively. The second terminal 43 of the switch 15 (connected to the common terminal 41 when a "H" level control signal cont is present) is connected with the second terminal of the switch 18, and the second terminal of the switch 17 is connected with the second terminal of the switch 16.

As shown in FIG. 1, the integrated circuit 10 of the first embodiment is structured by pairing these circuits at every adjacent pair of input-output ports P00, P01 and P02, P03.

Figure 2:
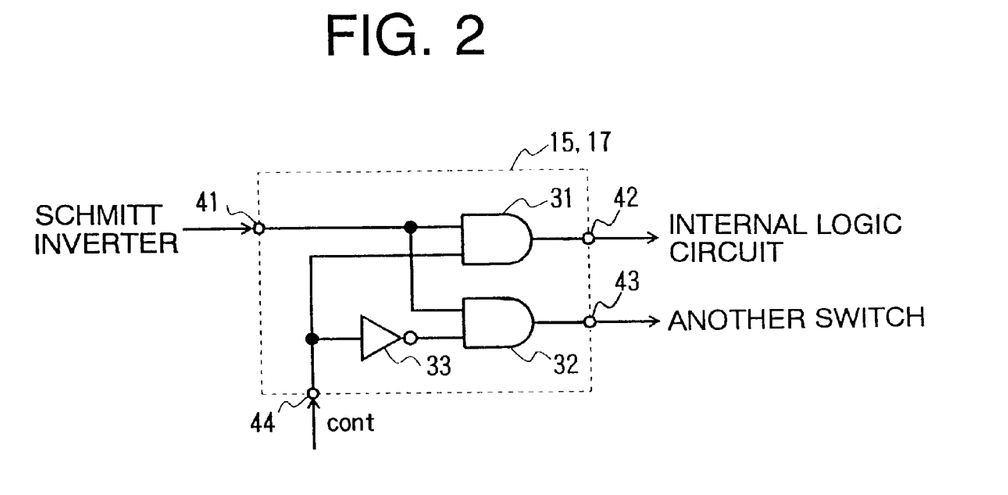
FIG. 2 is a circuit diagram of a switch used in the integrated circuit according to the first embodiment.

Now, an example of a switch used for the Schmitt inverter in the integrated circuit of the first embodiment with reference to FIG. 2. Each of the switches 15, 17, as shown in FIG. 2, is provided with two input AND circuits 31, 32 and an inverter 33. A common terminal 41 connected to the Schmitt inverter is connected with input terminals of the two input AND circuits 31, 32. A control signal input terminal 44 is connected with another input terminal of the two input AND circuits 31, 32. An output terminal of the two input AND circuit 31 is connected to a first terminal 42 connected to the internal logic circuit. Further, a signal from the control signal input terminal 44 is inputted into another input terminal of the two input AND circuit 32 through the inverter 33. The output of the two input AND circuit 32 is supplied to another switch via a second terminal 43.

A switch connected to each tristate circuit is structured similarly, therefore, no explanation thereof is given.

Next, an explanation will be given of the operation in the integrated circuit (test procedure of Schmitt inverter) according to the first embodiment.

When no "H" level control signal "cont" is inputted, in each switch, the common terminal 41 and the first terminal 42 are connected. Thus, in this case, the integrated circuit operates usually without transferring signals between switches e.g., 15 and 18 or 16 and 17.

During the test of the Schmitt inverter, the tristate circuit with its output connected to the same input-output port as the input of the Schmitt inverter to be tested is forced into a OFF state (inhibit state), and the tristate circuit with its output connected with the other input-output port of the pair is forced into a ON state.

For example, when the Schmitt inverter connected to the even-numbered input-output port (such as P00, P02) is tested, each tristate circuit with its output connected to the even-numbered input-output port is forced into its OFF state, and each tristate circuit with its output connected to the odd-numbered input-output port is in an active state. Then, the control signal "cont" is supplied to each switch so as to connect the common terminals 41 with the second terminals 43 in all switches.

When each part is controlled to be in this state, the output signal from the Schmitt inverter 11 is passed to the input-output port P01 through the switch 15, the switch 18 and the tristate circuit 14. Similarly, the same level signal as that from the Schmitt inverter connected with another even-numbered input-output port is passed to the adjacent input-output port paired with that even-numbered input-output port.

Thus, only while a test signal stepped waveform of which the signal level varies step by step is inputted into the even-numbered input-output port, a binary output signal level from the odd-numbered input-output port is measured, whereby it becomes possible to measure a threshold voltage of the Schmitt inverter with its input connected to the even-numbered input-output port.

Figure 3:
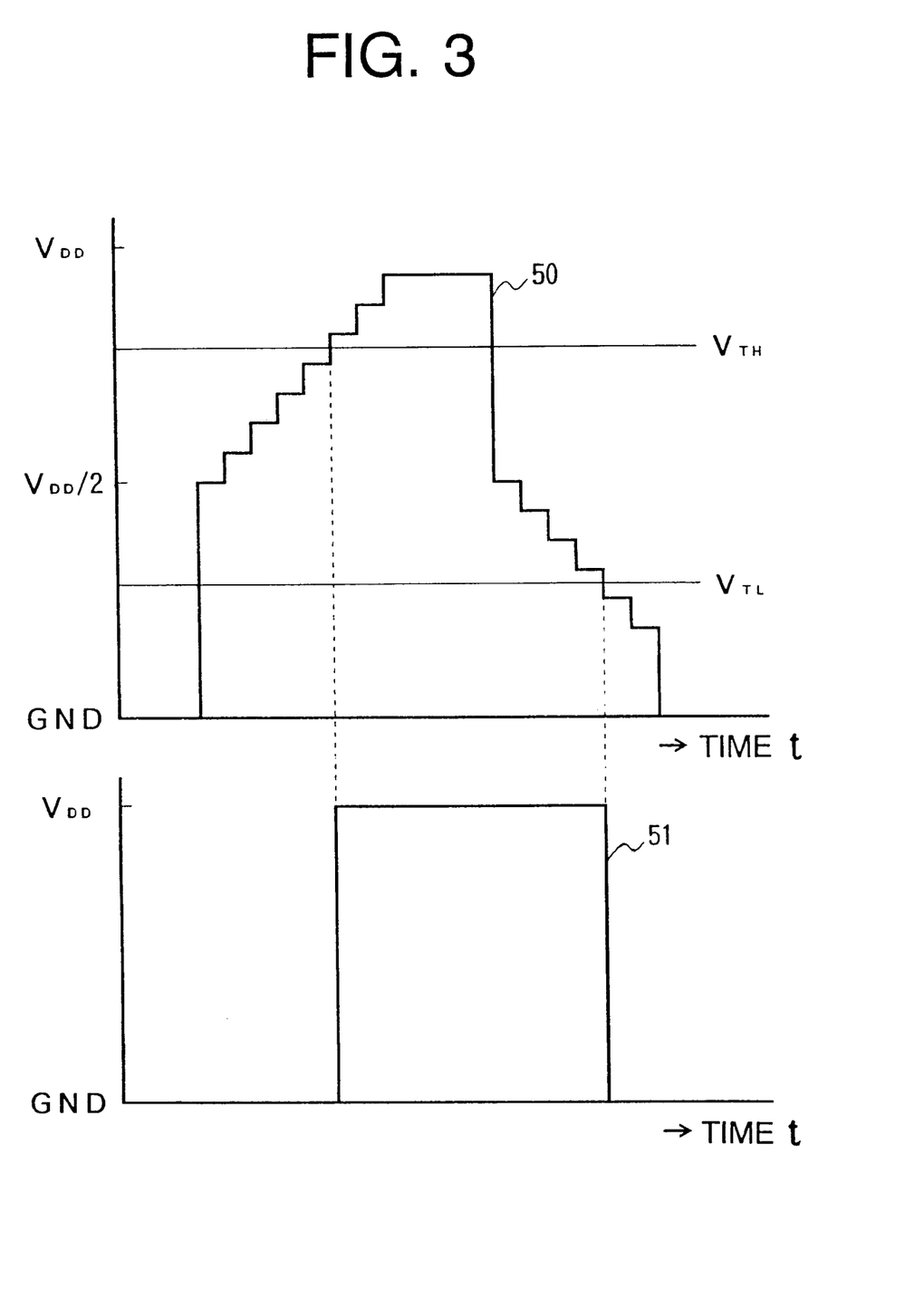
FIG. 3 is a view illustrating a correspondence relation between a test signal waveform and an output waveform to explain a characteristic evaluation procedure for a Schmitt inverter in the integrated circuit according to the first embodiment.

For example, when it is certain that the threshold voltage $V_{TH}$ at the H side of each Schmitt inverter is greater than ½ $V_{DD}$ and the threshold voltage $V_{TL}$ at the L side is less than ½ $V_{DD}$, the output signal outputted from each odd-numbered input-output port, a time arranging output signal waveform 51 is measured individually in response to a test input signal waveform 50 shown in FIG. 3, which is supplied to all even-numbered input-output ports. The threshold voltage of each Schmitt inverter can be measured as described below.

That is, first, an input voltage of the GND level is applied to each even-numbered input-output port, and then the input voltage is increased to the ½ $V_{DD}$ level. Initially, the "L" level signal is output from each odd-numbered input-output port. Thereafter, the signal level outputted from each odd-numbered input-output port is monitored while the input voltage is incrementally by a predetermined voltage step (such as 0.1V). Then, when each odd numbered input-output port switches binary signal level ("H" level signal is output), the input voltage at that time is noted. The noted input voltage level is the threshold $V_{TH}$ at the "H" side of the Schmitt inverter connected to a corresponding even-numbered input-output port paired with that odd numbered input-output port.

Thereafter, when signals from all odd-numbered input-output port switch to the "H" level, namely, when all thresholds $V_{TH}$ of Schmitt inverters with its connected to even-numbered input-output port have been measured, the input voltage to each even-numbered input-output port is decreased to ½ $V_{DD}$. Then the signal level from each odd-numbered input-output port of is monitored while the input voltage is incrementally decreased by a determined voltage step. Then, when each odd numbered input-output port switches binary signal level ("L" level signal is output), the input voltage level at that time is noted. The noted input voltage level is the threshold $V_{TL}$ at the "L" side of the Schmitt inverter with its output connected to a corresponding even-numbered input-output port paired with that input-output port.

After measuring all thresholds $V_{TL}$ of Schmitt inverters with input connected to even-numbered input-output port are measured the state of each tristate circuit is changed in order to test remaining Schmitt inverters. That is, each tristate circuit with its input connected to an odd-numbered input-output port is forced into its OFF state, and each tristate circuit connected to an even-numbered input-output port is forced to its active state. Then, the test input signal waveform is input to each odd-numbered input-output port, and the binary output signal level from each even-numbered input-output port is monitored. Thus threshold voltages $V_{TH}$, $V_{TL}$ of the Schmitt inverter with inputs connected to each odd-numbered input-output port are measured.

Figure 4:
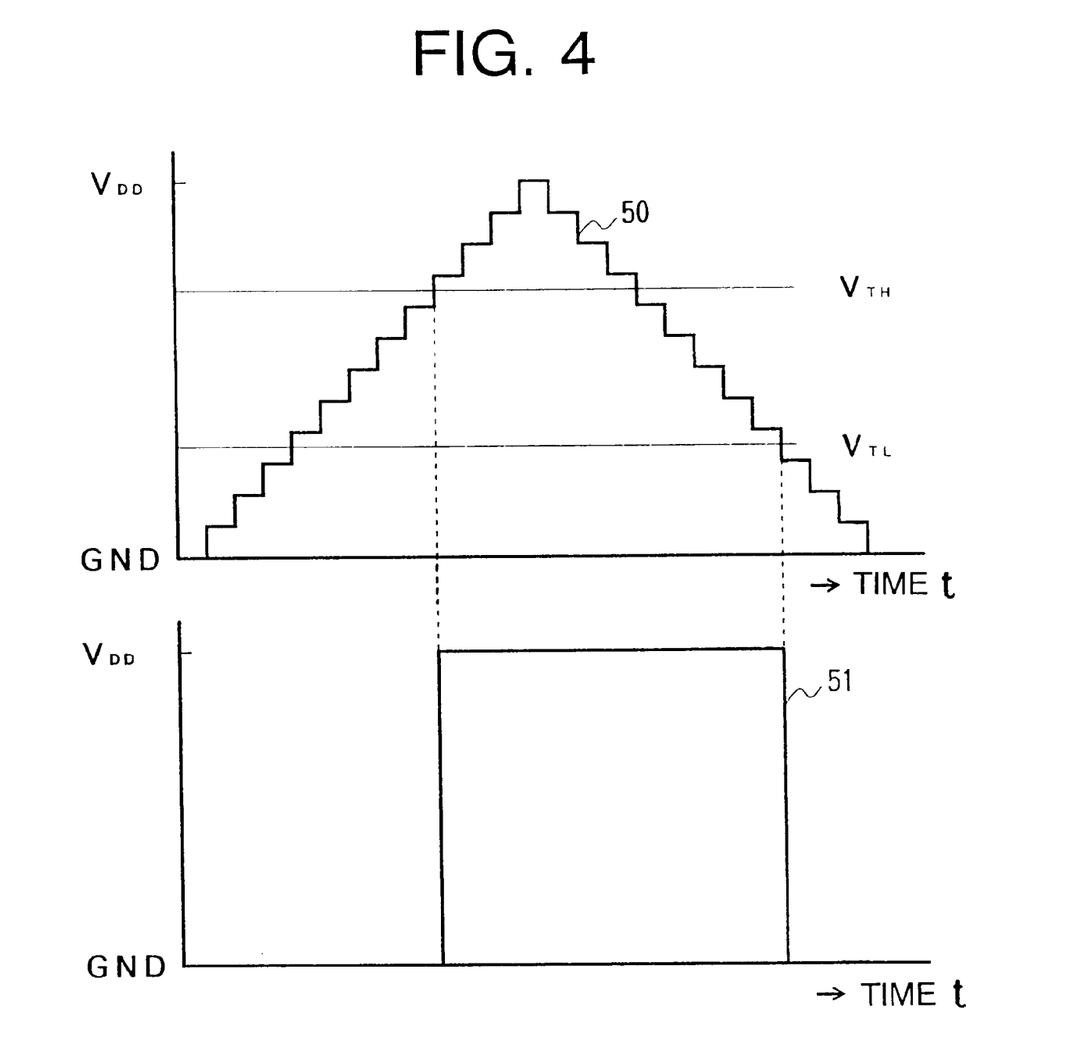
FIG. 4 is a view illustrating a correspondence relation between a test signal waveform and an output waveform to explain a characteristic evaluation procedure for a Schmitt inverter in the integrated circuit according to the first embodiment.

Additionally, a test input signal waveform is not limited to that shown in FIG. 3. For example, as shown in FIG. 4, a test signal waveform of which a level varies step by step from GND may be used. Further, it is unnecessary to input the same test signal waveform into all input-output ports used as input ports. For example, it is apparent that a test input signal waveform may be varied according whether a Schmitt inverter is to switch at TTL levels or at CMOS levels.

As above described, according to the integrated circuit in the first embodiment, plural Schmitt inverters in the integrated circuit can be tested in parallel without a functional test. Thus, it takes only a very short time to complete tests for Schmitt inverters. Further, a Schmitt inverter and a tristate circuit connected to adjacent input-output ports, namely, circuits which are originally arranged close to each other are merely connected by switches, therefore, there is no layout problem such as requiring additional wiring area.

Moreover, during the test, the internal logic circuit 21 is completely bypassed. Therefore, the power supply transient current is reduced compared with a prior art methods of measuring the threshold in a functional test. Further, power supply transient noise is reduced. Therefore it becomes possible to measure the threshold voltage power supply noise influence and more accurately.

<Second Embodiment>

Figure 5:
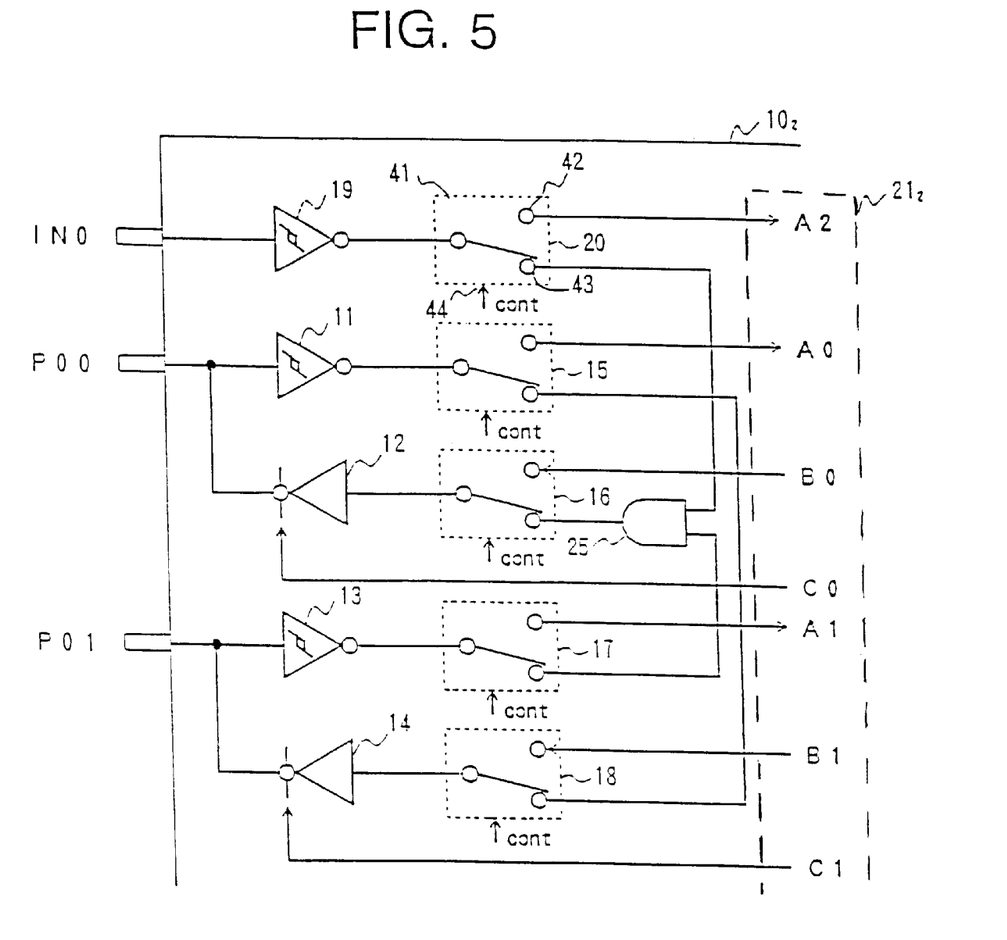
FIG. 5 is a circuit diagram illustrating an outline of an integrated circuit according to the second embodiment of the present invention; and, FIG. 6 is a circuit diagram of a switch used in the integrated circuit of each embodiment.

Next, an explanation will be given of a structure of the integrated circuit in the second embodiment with reference to FIG. 5. As shown in FIG. 5, a integrated circuit 102 in the second embodiment is provided with an input port INO only for input in addition to the input-output ports P01, P02. The input port INO is connected with a Schmitt inverter 19, and the output of the Schmitt inverter 19 is inputted into a common terminal 41 of a switch 20. A first terminal 42 of the switch 20 is connected to a node A2 in the internal logic circuit.

The input-output ports P01, P02 are connected to circuits of similar structures. In addition, a two input AND circuit 25 is arranged between the second terminal 43 of the switch 16 and the second terminal 43 of the switch 17, and a logical product (operated result of two input AND circuit 25) of a signal from the second terminal 43 of the switch 20 and a signal from the second terminal 43 of the switch 17 is inputted thereto.

In this integrated circuit, each Schmitt inverter is tested in accordance with a procedure mentioned hereinafter.

The Schmitt inverter 11, which is independent of input AND circuit 25 is tested in accordance with the same procedure for testing the integrated circuit in the first embodiment. When Schmitt inverters 13, 19, which may be coupled the two input AND circuit 25 are tested, individually one input of the two input AND circuit 25 is kept to "H" by supplying a "L" level signal to the input port INO and vise versa. Then, the Schmitt inverter 13 is tested incrementally by varying the input voltage level to the input-output port P01. Thereafter, the Schmitt inverter 19 is tested by incrementally varying the input voltage to the input port INO while a "L" level signal is supplied to the input of Schmitt inverter 13 at input-output port P01.

Additionally, when the Schmitt inverters 13, 19 are designed to have the same threshold voltage level, the the binary output signal level at the input-output port P00 may be used to indicate the threshold voltage of both the Schmitt inverters 13, 19 by supplying the same test signal waveform to both INO and P01, simultaneously.

<Modification>

The integrated circuit explained in the first and second embodiments is provided with Schmitt inverters and inverting tristate circuits, however, the circuit structure explained in each embodiment can be also applied to an integrated circuit with a Schmitt non-inverting buffer instead of Schmitt inverters. The circuit structure can be also applied to an integrated circuit with a non-inverting tristate circuit. Incidentally, it should be noted that a binary waveform for a test input signal waveform varies in accordance with the application method of these alternate circuit structures as explained in each embodiment with appropriate inversion.

Moreover, in the integrated circuit of the second embodiment, the two input AND circuit 25 may be replaced with a two input OR circuit. When a two input OR circuit is used, a "H" level signal is input into one port, INO or P01 whereby a Schmitt inverter connected to the other port P01 or INO is tested. Additionally, when an integrated circuit having an odd-number of input-output ports and individual input ports is fabricated, a two input AND circuit may be used. That is, an integrated circuit corresponding to the second embodiment 102 can be fabricated by using one input-output port as an input port.

Figure 6:
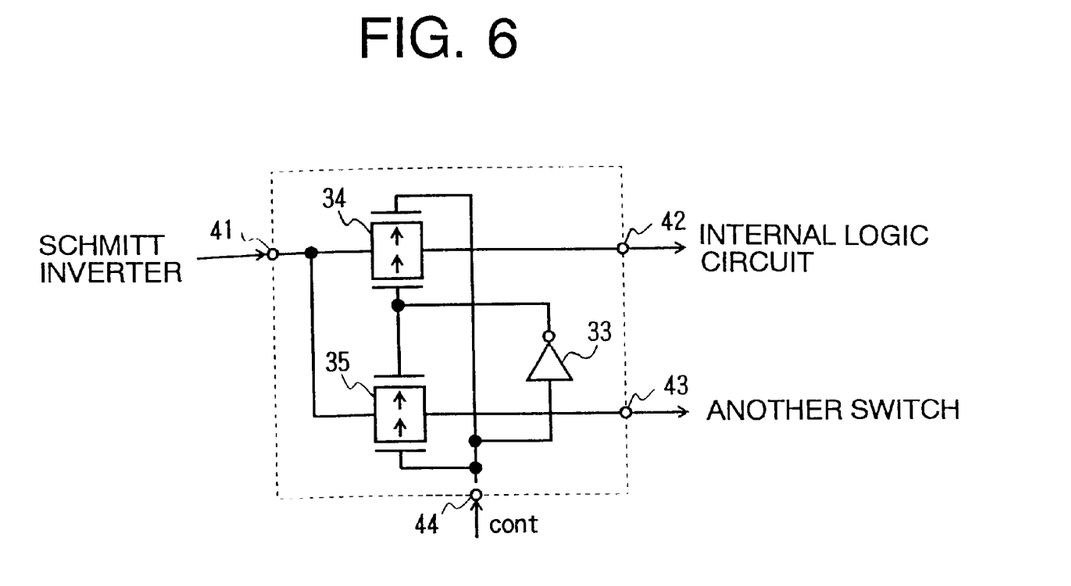

Further, as shown in FIG. 6, a switch including analog switches (transfer gates) 34, 35 and an inverter 33 may be used instead of the switch shown in FIG. 2.

The integrated circuit 10 and 102 in each embodiment is the so-called LSI micro controller LSI. However, it is apparent that the present invention may be applied to a general LSI circuit having a Schmitt input circuit.

As explained in detail, the integrated circuit of the present invention is designed in a manner such that plural Schmitt input circuits can be tested in parallel and such that the internal logic circuit is bypassed. Therefore, it is possible to evaluate each Schmitt input circuit at a high speed and accurately.

This invention being thus described, it will be obvious that same may be varied in various ways. Such variations are not to be regarded as departure from the spirit and scope of the invention, and all such modifications would be obvious for one skilled in the art intended to be included within the scope of the following claims.

What is claimed is:

1. An integrated circuit comprising:

an internal logic circuit;

plural input ports inputting input signals to be supplied to the internal logic circuit;

plural Schmitt input circuits receiving said input signals and outputting signals corresponding to the input signals, respectively;

plural output ports outputting output signals from the internal logic circuit; and plural switch circuits each connected between the internal logic circuit and a corresponding one of the plural Schmitt input circuits and a corresponding, one of the plural output ports and selectively feeding the input signal from the connected Schmitt circuit to the internal logic circuit or to the connected corresponding output port.

2. An integrated circuit according to claim 1, wherein each of the plural output ports is connected to a corresponding one of the plural Schmitt input circuits through the plural switch circuits, so as to reduce wiring by a positional relationship between the plural Schmitt input circuits and the plural outputs ports.

3. An integrated circuit comprising:

an internal logic circuit;

plural input-output ports inputting input signals to be supplied to the internal logic circuit and outputting output signals from the internal logic Circuit;

plural Schmitt input circuits receiving said input signals and outputting signals corresponding to the input signals, respectively;

plural tristate circuits selectively feeding said output signals from the internal logic circuit to corresponding ones of the plural input-output ports, respectively;

a control circuit selecting on-off control of the plural tristate circuits; and plural switch circuits each connected between the internal logic circuit and a corresponding one of the plural Schmitt input circuits and a corresponding one one of the plural tristate circuits and selectively feeding the input signal from the connected Schmitt circuit to the internal logic circuit or to the connected corresponding tristate circuit.

4. An integrated circuit according to the claim 3, wherein the plural switch circuits and the plural tristate circuits are connected so as to be able to test the plural Schmitt input circuits without changing pairs of said plural input-output ports used for testing the plural Schmitt input circuits.

5. An integrated circuit according to claim 4, further comprising:

an input port for inputting an individual input signal to the internal logic circuit;

an individual Schmitt input circuit receiving said individual input signal and outputting a signal corresponding to the individual input signal;

an individual switch circuit receiving the output signal from the individual Schmitt input circuit; and a logic operational circuit connected between two of said plural switches, one of said two switches driving one of said plural tristate circuits and outputting a logic operational result of signals inputted from the other connected switch circuit and the individual switch circuit.

6. An integrated circuit according to claim 3, further comprising:

an input port for inputting an individual input signal to the internal logic circuit;

an individual Schmitt input circuit receiving said individual input signal and outputting a signal corresponding to the individual input signal;

an individual switch circuit receiving the output signal from the individual Schmitt input circuit; and a logic operational circuit connected between two of said plural switches, one of said two switches driving one of said neural tristate circuits and outputting a logic operational result of signals inputted from the other connected switch circuit and the individual switch circuit.

7. An integrated circuit according to claim 3, wherein each of the plural tristate circuits is connected to one of the plural input ports through the plural switch circuits, is selected so as to reduce wiring by a positional relation between the plural Input ports and the plural tristate circuits.

8. An semiconductor integrated circuit including a plurality of input circuits, comprising:

a first port;

a first input circuit having a first input terminal and a first output terminal, the first input terminal connected to the first port and outputting a first output signal from the first output terminal in response to a first input signal applied to the first port;

a second port;

a second input circuit having a second input terminal and a second output terminal connected to the second port, the second input circuit outputting a second output signal from the second output terminal in response to a second input signal applied to the second port;

an internal circuit;

a first output circuit having a third input terminal and a third output terminal, the third output terminal connected to the second port, the first output circuit outputting a third output signal from the third output terminal in response to the first output signal, wherein the third output terminal outputs the third output signal while the second input signal is not applied to the second port;

a first switching circuit connected to the first output terminal and transferring the first output signal to the internal circuit in a normal operation mode, the first switching circuit transferring the first output signal to the third input terminal in a test mode;

a second switching circuit coupled to the second output terminal, the second switching circuit transferring the second output signal to the internal circuit in the normal operation mode.

9. The semiconductor integrated circuit according to claim 8, further comprising:

a second output circuit having a fourth input terminal and a fourth output terminal connected to the first port, the second output circuit outputting a forth output signal from the forth output terminal in response to the second output signal, wherein the fourth output circuit outputs the fourth output signal while the first input signal is not applied to the first port;

wherein the second switching circuit transfers the second output signal to the fourth input terminal in the test mode.

10. The semiconductor integrated circuit according to claim 8, further comprising:

a third port;

a third input circuit having a fourth input terminal and a fourth output terminal, the fourth input terminal connected to the third port, the third input circuit outputting a fourth output signal from the fourth output terminal in response to a third input signal applied to the third port;

a combinational logic circuit combining said second output signal and said fourth output signal to provided a combined signal, said combined signal being provided to the second switching circuit during test mode.

* * * * *